(12) United States Patent
Chou

(10) Patent No.: US 9,479,169 B1
(45) Date of Patent: Oct. 25, 2016

(54) CONTROL CIRCUIT APPLIED IN E-FUSE SYSTEM AND RELATED METHOD

(71) Applicant: Elite Semiconductor Memory Technology Inc., Hsinchu (TW)

(72) Inventor: Min-Chung Chou, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 0 days.

(21) Appl. No.: 14/979,584

(22) Filed: Dec. 28, 2015

(51) Int. Cl.
*G11C 16/20* (2006.01)
*H03K 19/003* (2006.01)
*H03K 19/00* (2006.01)
*G11C 17/16* (2006.01)

(52) U.S. Cl.
CPC ............. *H03K 19/003* (2013.01); *G11C 17/16* (2013.01); *H03K 19/0008* (2013.01)

(58) Field of Classification Search
CPC ....... G11C 17/18; G11C 16/20; G11C 16/26; G11C 17/16; H03K 19/0008; H03K 19/003
USPC .......................................................... 326/38
See application file for complete search history.

(56) References Cited

U.S. PATENT DOCUMENTS

2002/0122331 A1\* 9/2002 Santin .................... G11C 16/20
365/185.09

\* cited by examiner

*Primary Examiner* — Don Le
(74) *Attorney, Agent, or Firm* — Winston Hsu; Scott Margo

(57) ABSTRACT

A control circuit applied in an e-fuse system selectively operates in a feeding mode and a reading mode. When the control circuit operates in the feeding mode, the control circuit is arranged to store a program code for indicating whether to connect a fuse of the e-fuse system thereto; and when the control circuit operates in the reading mode, the control circuit is arranged to read a state of the fuse of the e-fuse system coupled to the control circuit.

17 Claims, 6 Drawing Sheets

CONTROL CIRCUIT APPLIED IN E-FUSE SYSTEM AND RELATED METHOD

BACKGROUND OF THE INVENTION

1. Field of the Invention

The present invention relates to an e-fuse system, and more particularly, to a control circuit applied in an e-fuse system and a related method.

2. Description of the Prior Art

A conventional semiconductor device includes a fuse circuit with a redundancy memory cell, wherein the fuse circuit is programmed with the address of a memory cell undergoing failure, and is used to determine whether to access a redundancy memory cell. Herein, the term "program" means a series of operations of cutting or not cutting a fuse included in the fuse circuit for a corresponding target data. This architecture of the conventional fuse circuit applied to semiconductor devices takes up a considerable area and consumes significant power.

SUMMARY OF THE INVENTION

One of the objectives of the present invention is therefore to provide a control circuit and a related method applied in an e-fuse system which effectively reduces the usage area to solve the abovementioned problem.

According to an embodiment of the present invention, a control circuit applied in an e-fuse system is disclosed, wherein the control circuit selectively operates in a feeding mode and a reading mode. When the control circuit operates in the feeding mode, the control circuit is arranged to store a program code for indicating whether to disconnect a fuse of the e-fuse system; and when the control circuit operates in the reading mode, the control circuit is arranged to read a state of the fuse of the e-fuse system coupled to the control circuit.

According to an embodiment of the present invention, a control method of an e-fuse system is disclosed, wherein the control method comprises: selectively operating in a feeding mode and a reading mode; when operating in the feeding mode, storing a program code for indicating whether to disconnect a fuse of the e-fuse system; and when operating in the reading mode, reading a state of the fuse of the e-fuse system.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should not be interpreted as a close-ended term such as "consist of". Also, the term "couple" is intended to mean either an indirect or direct electrical connection. Accordingly, if one device is coupled to another device, that connection may be through a direct electrical connection, or through an indirect electrical connection via other devices and connections.

Figure 1:
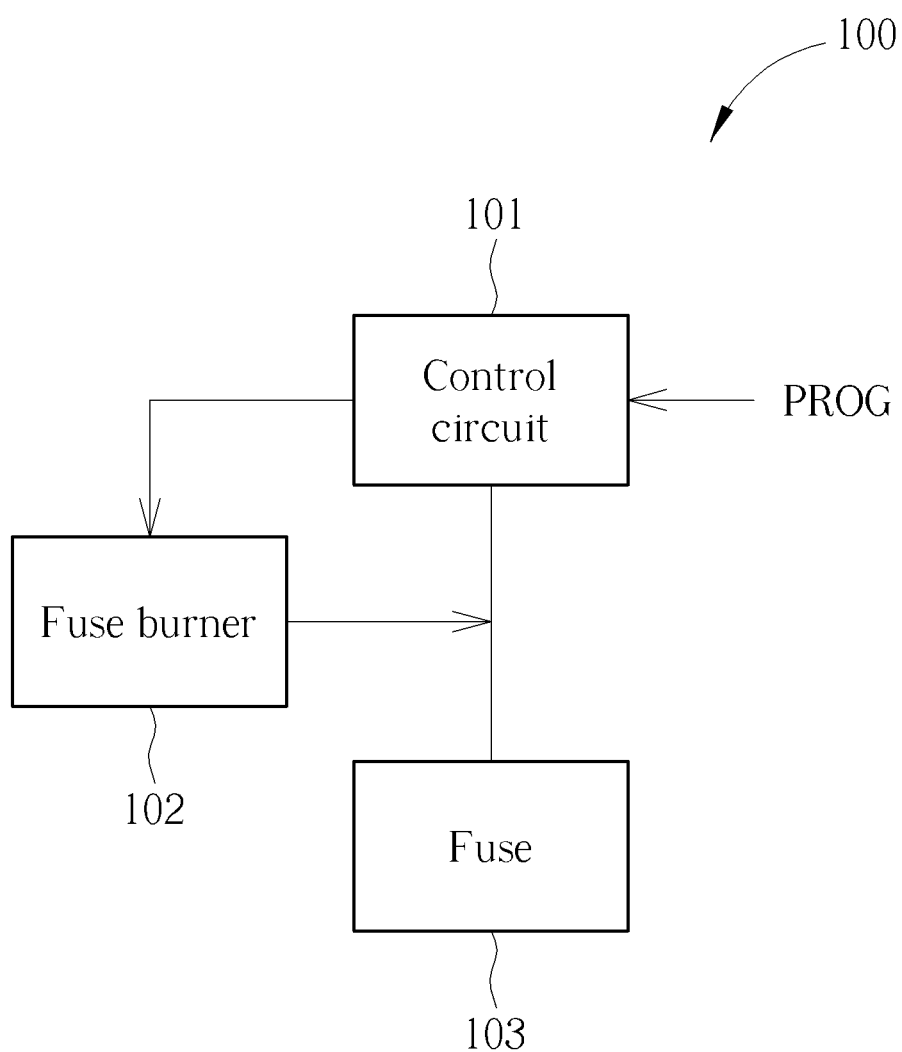
FIG. 1 is a diagram illustrating an e-fuse system according to an embodiment of the present invention.

FIG. 1 is a diagram illustrating an e-fuse system 100 according to an embodiment of the present invention. As shown in FIG. 1, the e-fuse system 100 comprises a control circuit 101, a fuse burner 102 and a fuse 103, wherein the control circuit 101 is arranged to selectively operate in a feeding mode and a reading mode. When the control circuit 101 operates in the feeding mode, the control circuit 101 stores a program code PROG which indicates whether to connect the fuse 103 with the control circuit 101 via the fuse burner 102. When the control circuit 101 operates in the reading mode, the control circuit checks whether the fuse 103 is disconnected or not. The fuse burner 102 coupled to the control circuit 101 is arranged to receive the program code PROG stored in the control circuit 101 and then determine whether to connect the fuse 103 with the control circuit 101 according to the program PROG.

Figure 2:
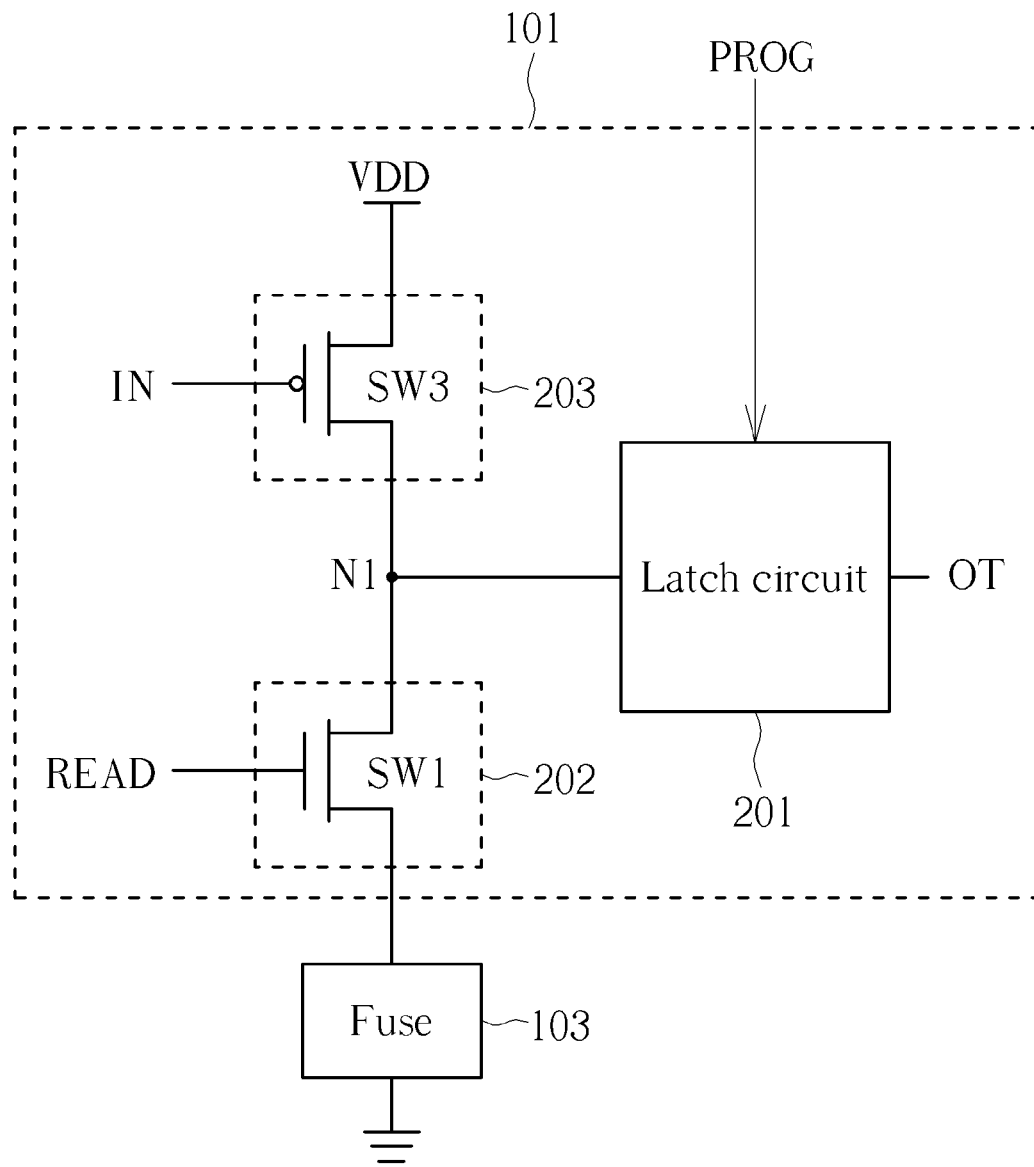
FIG. 2 is a diagram illustrating a control circuit of an e-fuse system according to an embodiment of the present invention.

FIG. 2 is a diagram illustrating the control circuit 101 of the e-fuse system 100 according to an embodiment of the present invention. As shown in FIG. 2, the control circuit 101 comprises a latch circuit 201, a reading circuit 202, an initializing circuit 203 and an output terminal OT, wherein the latch circuit 201 is arranged to store the program code PROG at the output terminal OT when the control circuit operates in the feeding mode. The reading circuit 202 coupled to the fuse 103 is arranged to check the status of the fuse 103 when the control circuit 101 operates in the reading mode by a reading signal READ, and the initializing circuit 203 is coupled to a predetermined voltage VDD is arranged to initialize the latch circuit 201 by an initializing signal IN. The reading circuit may be implemented by a transistor. In this case, the reading circuit 202 is implemented by an NMOS SW1 as a switch controlled by the reading signal READ. The initializing circuit 203 in this embodiment is implemented by a PMOS SW3 as a switch controlled by the initializing signal IN. This is only for illustrative purposes, however, and not a limitation of the present invention. As shown in FIG. 2, a source terminal of the PMOS SW3 is coupled to the predetermined voltage VDD, a gate terminal of the PMOS SW3 is coupled to the initializing signal IN, and a drain terminal of the PMOS SW3 is coupled to a node N1. Regarding the NMOS SW1, a source terminal of the NMOS SW1 is coupled to the fuse 103, a gate terminal of the NMOS SW1 is coupled to the reading signal READ, and a drain terminal is coupled to the node N1. Specifically, the initializing signal IN may turn on the PMOS SW3 to direct the predetermined voltage VDD to the latch circuit 201 through the node N1 for initializing the logic value at the output terminal OT. The reading signal READ may turn on the NMOS SW1 to check the status of the fuse 103 by reading the logic value at the output terminal OT when the control circuit 101 operates in the reading mode. The function and the architecture of the latch circuit 201 will be discussed in the following paragraphs.

Figure 3:
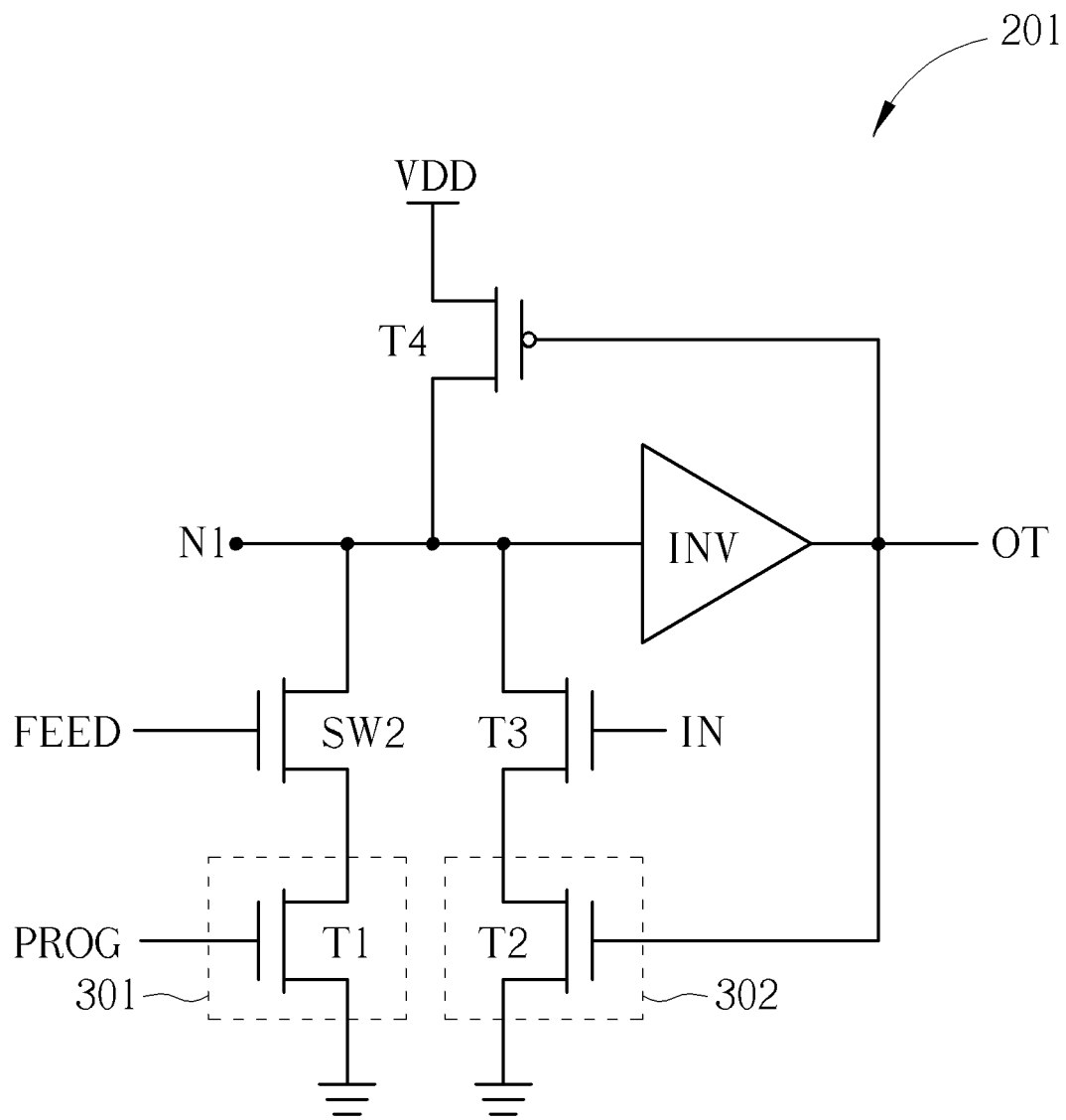
FIG. 3 is a diagram illustrating a latch circuit of a control circuit according to an embodiment of the present invention.

FIG. 3 is a diagram illustrating the latch circuit 201 of the control circuit 101 according to an embodiment of the present invention. As shown in FIG. 3, the latch circuit 201 comprises an input unit 301 including a transistor T1, a feedback unit 302 including a transistor T2, a switch SW2, transistors T3 and T4, and an inverter INV. In this embodiment, the transistors T1-T3 and the switch SW2 are implemented by NMOS, and the transistor T4 is implemented by a PMOS. This is merely for illustrative purposes. As shown in FIG. 3, a source terminal of the transistor T1 is coupled to a predetermined voltage (which in this embodiment is ground), a gate terminal of the transistor T1 is coupled to the program code PROG, and a drain terminal of the transistor T1 is coupled to a source terminal of the switch SW2. Regarding the switch SW2, a drain terminal of the switch SW2 is coupled to the node N1, and a gate terminal of the switch SW2 is coupled to the feeding signal FEED. Regarding the feedback unit 302, a source terminal to the transistor T2 is coupled to ground, a gate terminal of the transistor T2 is coupled to the output terminal OT, and a drain terminal to the transistor T2 is coupled to a source terminal of the transistor T3. Regarding the transistor T3, a gate terminal of the transistor T3 is coupled to the initializing signal IN and a drain terminal is coupled to the node N1. Regarding the transistor T4, a source terminal of the transistor T4 is coupled to the predetermined voltage VDD, a gate terminal of the transistor T4 is coupled to the output terminal OT, and a drain terminal of the transistor T4 is coupled to the node N1. Regarding the inverter INV, an input terminal of the inverter INV is coupled to the node N1 and the output terminal of the inverter INV is coupled to the output terminal OT. The detailed description of operation in the feeding mode and the reading mode will be discussed in the following paragraphs.

Figure 4:
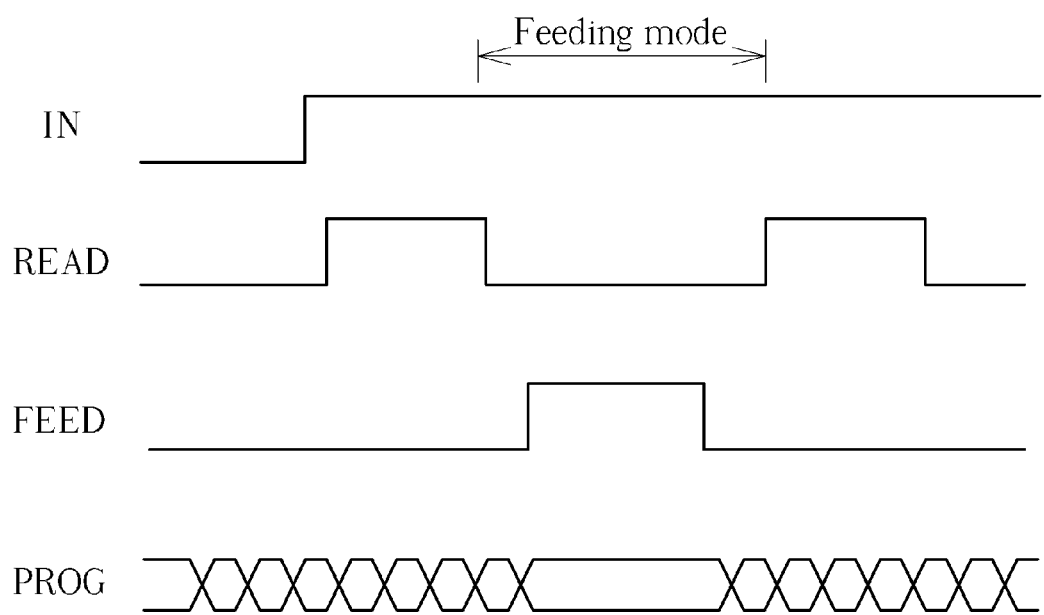
FIG. 4 is a timing diagram illustrating an initializing signal, reading signal and feeding signal according to an embodiment of the present invention.
Figure 5:
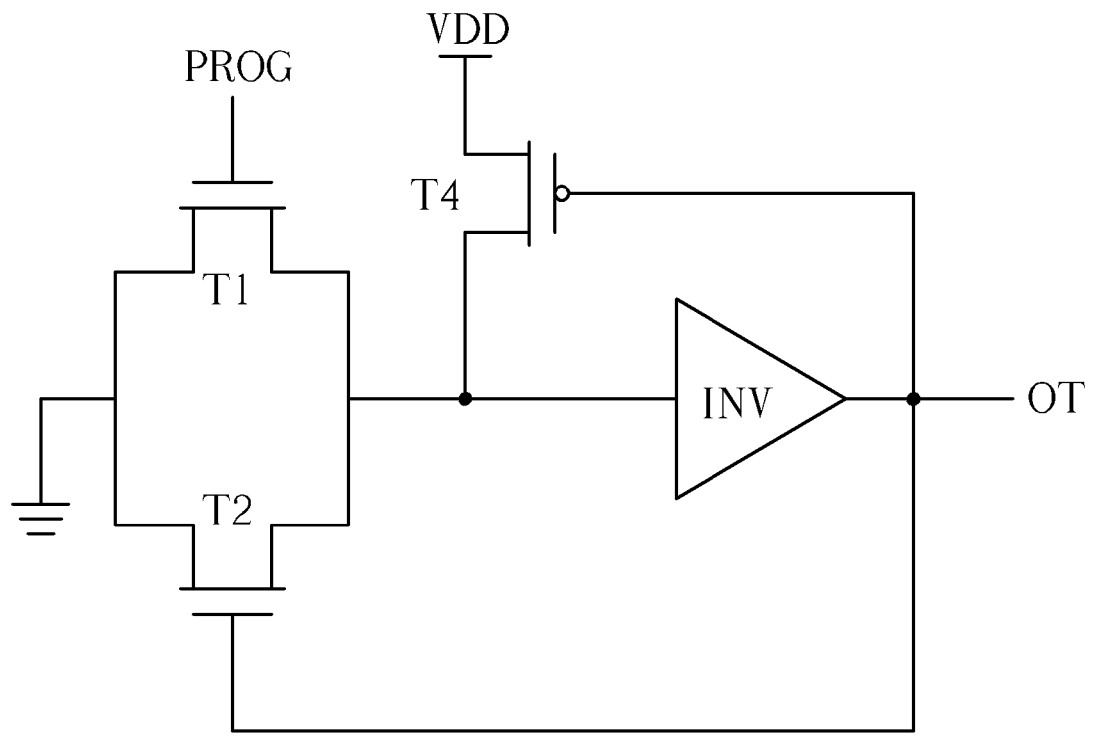
FIG. 5 is a diagram illustrating a control circuit operating in the feeding mode according to an embodiment of the present invention.
Figure 6:
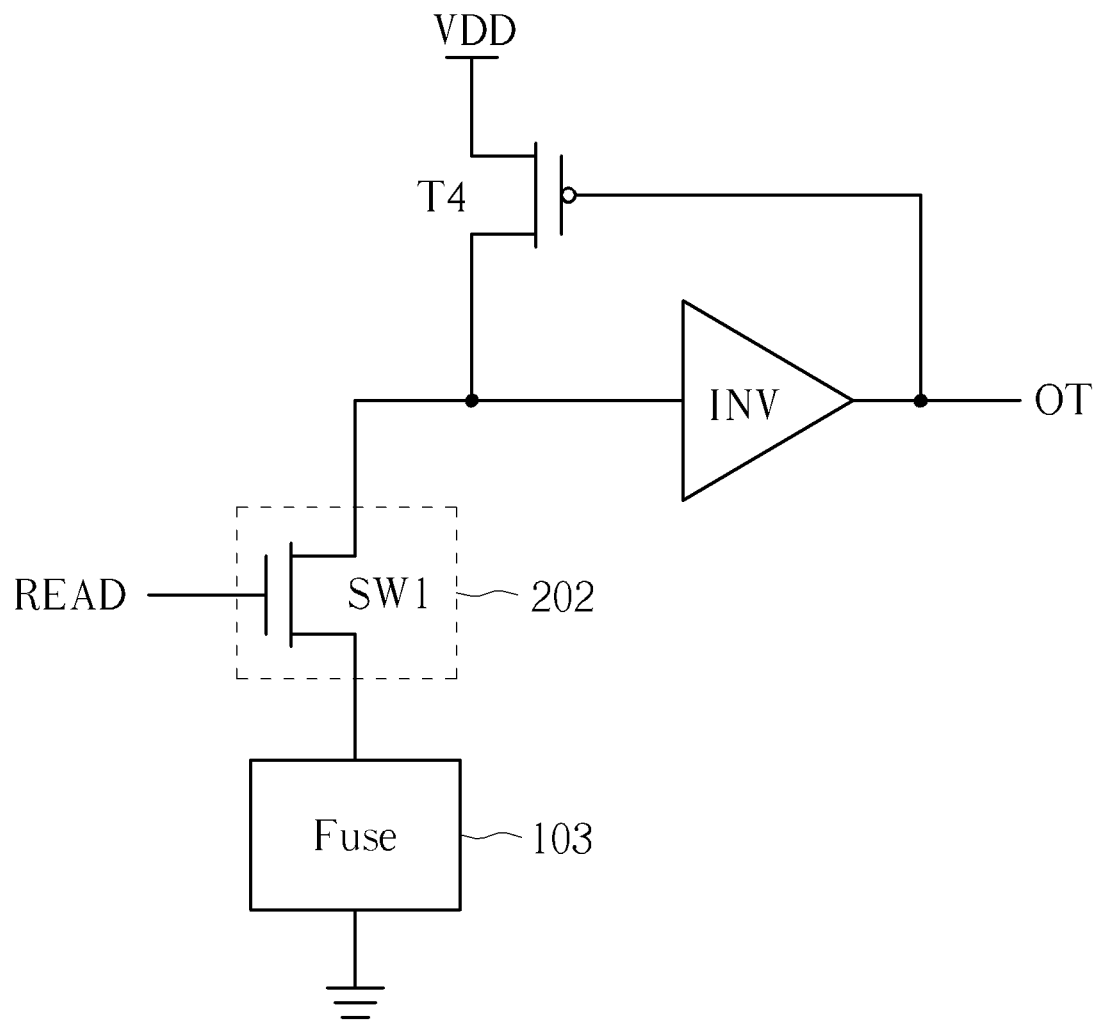
FIG. 6 is a diagram illustrating a control circuit operating in the reading mode according to an embodiment of the present invention.

Refer to FIG. 2 and FIG. 3 as well as FIG. 4, which is a timing diagram illustrating an initializing signal, reading signal and feeding signal according to an embodiment of the present invention. As shown in FIG. 4, when the e-fuse system 100 initializes, the initializing signal IN is logic low (i.e. logic value '0'), the initializing circuit 203 is accordingly turned on to direct the predetermined voltage VDD (i.e. logic value '1') to the node N1, and the logic value at the output terminal OT thus becomes logic value '0'. In this way, the latch circuit is initialized. When the feeding signal FEED becomes logic high, the control circuit 101 operates in the feeding mode. The switch SW2 controlled by the feeding signal FEED is thus turned on. At this time, the transistors T2, T3 and T4 and the inverter INV constitute a latch, and the reading circuit 202 and the initializing circuit 203 are turned off. This is shown in FIG. 5, which is a diagram illustrating the control circuit 101 operating in the feeding mode according to an embodiment of the present invention. The program code PROG is received by the transistor T1 and shown at the output terminal OT. If the program code PROG is logic value '1', the fuse burner 102 coupled to the control circuit 101 is informed by logic value '1' at the output terminal OT to connect the fuse 103 with the reading circuit 202 of the control circuit 101. Otherwise, the fuse 103 is disconnected from the control circuit 101. When the reading signal READ becomes logic high, the control circuit 101 operates in the reading mode. This is shown in FIG. 6, which is a diagram illustrating the control circuit 101 operating in the reading mode according to an embodiment of the present invention. The NMOS SW1 controlled by the reading signal READ is thus turned on, and the initializing circuit 203 and the switch SW2 are both turned off. The status of the fuse 103 is reported at the output terminal OT to indicate whether the fuse 103 is connected with the reading circuit 202 by the fuse burner 102.

Briefly summarized, the present invention discloses a novel architecture of the control circuit applied in an e-fuse system which effectively reduces both the chip area and the power consumption.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A control circuit applied in an e-fuse system, wherein the control circuit selectively operates in a feeding mode and a reading mode, wherein when the control circuit operates in the feeding mode, the control circuit is arranged to store a program code for indicating whether to connect a fuse of the e-fuse system thereto; and when the control circuit operates in the reading mode, the control circuit is arranged to read a state of the fuse of the e-fuse system coupled to the control circuit.

2. The control circuit of claim 1, wherein when the control circuit operates in the feeding mode, the control circuit stores the program code, and a fuse burner of the e-fuse system determines whether to connect the fuse of the e-fuse system with the control circuit according to the program code.

3. The control circuit of claim 2, comprising:
an output terminal, coupled to the fuse burner;
a latch circuit, coupled to the output terminal, wherein when the control circuit operates in the feeding mode, the latch circuit is arranged to store the program code at the output terminal; and
a reading circuit, coupled between the fuse and the output terminal, wherein when the control circuit operates in the reading mode, the reading circuit is arranged to read the state of the fuse of the e-fuse system.

4. The control circuit of claim 3, wherein the reading circuit comprises a first switch, and when the control circuit operates in the reading mode, the reading circuit receives a reading signal to turn on the first switch to read the state of the fuse of the e-fuse system.

5. The control circuit of claim 4, wherein the latch circuit comprises a second switch, and when the control circuit operates in the feeding mode, the latch circuit receives a feeding signal to turn on the second switch to store the program code, and the first switch is turned off.

6. The control circuit of claim 3, wherein the latch circuit comprises an input unit for receiving the program code and a feedback unit coupled to the output terminal.

7. The control circuit of claim 3, further comprising:
an initializing circuit, coupled to the latch circuit of the control circuit, wherein the initializing circuit is arranged to initialize the latch circuit by an initializing signal to make the output terminal have logic value "0".

8. The control circuit of claim 7, wherein the initializing circuit comprises a third switch coupled between a reference voltage and the latch circuit, and when the third switch is turned on by the initializing signal, the initializing circuit initializes the latch circuit to make the output terminal have logic value "0".

9. The control circuit of claim 8, wherein the first switch, the second switch, and the third switch are Metal-Oxide-Semiconductor Field-Effect Transistors (MOSFET).

10. A control method of an e-fuse system, comprising:
selectively operating in a feeding mode and a reading mode;
when operating in the feeding mode, storing a program code for indicating whether to connect a fuse of the e-fuse system; and
when operating in the reading mode, reading a state of the fuse of the e-fuse system;
wherein when operating in the feeding mode, the method further comprises:
storing the program code; and
utilizing a fuse burner of the e-fuse system to determine whether to connect the fuse of the e-fuse system according to the program code.

11. The control method of claim 10, further comprising:
utilizing a latch to store the program code when operating in the feeding mode; and
utilizing a reading circuit to read the state of the fuse of the e-fuse system when operating in the reading mode.

12. The control method of claim 11, wherein the reading circuit comprises a first switch, and when operating in the reading mode, the reading circuit receives a reading signal to turn on the first switch to read the state of the fuse of the e-fuse system.

13. The control method of claim 12, wherein the latch circuit comprises a second switch, and when the control circuit operates in the feeding mode, the latch circuit receives a feeding signal to turn on the second switch to store the program code, and the first switch is turned off.

14. The control method of claim 11, wherein the latch circuit comprises an input unit for receiving the program code and a feedback unit coupled to the output terminal.

15. The control method of claim 11, further comprising:
utilizing an initializing circuit coupled to the latch circuit to initialize the latch circuit by an initializing signal.

16. The control method of claim 15, wherein the initializing circuit comprises a third switch coupled between a reference voltage and the latch circuit, and when the third switch is turned on by the initializing signal, the initializing circuit initializes the latch circuit.

17. The control method of claim 16, wherein the first switch, the second switch, and the third switch are Metal-Oxide-Semiconductor Field-Effect Transistors (MOSFET).

* * * * *